(12) United States Patent
Floberg (10) Patent No.: US 10,608,587 B2
(45) Date of Patent: Mar. 31, 2020

(54) CRYSTAL OSCILLATOR CIRCUIT

(71) Applicant: Axis AB, Lund (SE)

(72) Inventor: Henrik Floberg, Lund (SE)

(73) Assignee: AXIS AB, Lund (SE)

( * ) Notice: Subject to any disclaimer, the term of this patent is extended or adjusted under 35 U.S.C. 154(b) by 0 days.

(21) Appl. No.: 16/178,621

(22) Filed: Nov. 2, 2018

(65) Prior Publication Data

US 2019/0158025 A1 May 23, 2019

(30) Foreign Application Priority Data

Nov. 17, 2017 (EP) .................................... 17202285

(51) Int. Cl.
*H03B 5/36* (2006.01)
*H03B 5/32* (2006.01)
*H03L 1/02* (2006.01)

(52) U.S. Cl.
CPC ............... *H03B 5/36* (2013.01); *H03B 5/326* (2013.01); *H03L 1/026* (2013.01); *H03B 2200/0082* (2013.01)

(58) Field of Classification Search
CPC ...... H03B 5/1228; H03B 5/1215; H03B 5/04; H03B 5/06; H03B 5/1212; H03B 5/124; H03B 5/1243; H03B 2201/025; H03B 5/1265; H03B 2200/0038; H03B 5/36; H03B 5/326; H03B 2200/0082; H03L 1/026

USPC .............................................. 331/158, 116 FE
See application file for complete search history.

(56) References Cited

U.S. PATENT DOCUMENTS

| 4,862,114 A | 8/1989 | Kleinberg | |
| 5,994,970 A * | 11/1999 | Cole ...................... | H03L 1/026 331/116 FE |
| 9,413,341 B1 | 8/2016 | Ho et al. | |

FOREIGN PATENT DOCUMENTS

| CN | 104052465 A1 | 9/2014 |
| EP | 2 634 914 A1 | 9/2013 |

OTHER PUBLICATIONS

"HCMOS Crystal Oscillators," Fairchild Semiconductor Application Note 340, May 1983, © 1998 Fairchild Semiconductor Corporation, pp. 1-5.
Extended European Search Report and Opinion for European Application No. 17202285.7, dated Jun. 6, 2018.

* cited by examiner

*Primary Examiner* — Arnold M Kinkead
(74) *Attorney, Agent, or Firm* — Xsensus LLP (57) ABSTRACT

A method and crystal oscillator circuit match a supply voltage with a drive level of a crystal. The crystal oscillator circuit is based on a Pierce oscillator circuit which further includes a capacitor $C_d$. The capacitor $C_d$ together with the load capacitor act as a capacitive voltage divider and the capacitance of this capacitor may be selected to reduce the supply voltage to match the drive level of the crystal oscillator without affecting the oscillation margin of the crystal.

9 Claims, 5 Drawing Sheets

CRYSTAL OSCILLATOR CIRCUIT

CROSS REFERENCE TO RELATED APPLICATION

This application is based upon and claims the benefit of priority from European Patent Application No. 17202285.7, filed Nov. 17, 2017; the entire contents of which are incorporated herein by reference.

TECHNICAL FIELD

Embodiments herein relate to a crystal oscillator circuit. In particular, the embodiments herein relate to matching a supply voltage for an amplifier to a drive level of a quartz crystal in the crystal oscillator circuit and an electronic device comprising the crystal oscillator circuit.

BACKGROUND

A crystal oscillator circuit consists of a feedback network with an amplifier or a gain element and a crystal. Historically both of these two building blocks were designed and manufactured by companies specializing in frequency control products. However this paradigm has changed as separate companies design and manufacture crystals and amplifiers. This has generated problems with matching the amplifier, or gain element, with the crystal.

An important factor for having a well-functioning crystal oscillator is that a supply voltage for the amplifier should at least roughly match a drive level of the quartz crystal, otherwise the crystal will have problem with achieving the target frequency and experience accelerated aging. There are different solutions explained in the prior art to match the supply voltage with the drive level of the crystal and a solution often recommended by the suppliers is to use a so called Pierce oscillator circuit with the addition of a damping resistor. The damping resistor will indeed damp the supply voltage for the crystal. However it will also affect the oscillation capabilities of the crystal. That is an oscillation margin will decrease and in some cases imply that the crystal does not start oscillating at all.

SUMMARY

In light of above it is an object of embodiments herein to provide a technique for matching a supply voltage with a drive level of a crystal in a crystal oscillator circuit.

According to one aspect of embodiments herein, the object is achieved by a crystal oscillator circuit. The crystal oscillator circuit comprises an inverting amplifier having an input and an output, and a feedback resistor having a first terminal connected to the input of the inverting amplifier, and a second terminal connected to the output of the inverting amplifier.

The crystal oscillator circuit further comprises a quartz crystal having a first terminal and a second terminal; a first load capacitor connected between the first terminal of the quartz crystal and a signal ground; a second load capacitor connected between the second terminal of the quartz crystal and the signal ground.

The crystal oscillator circuit further comprises a third capacitor connected between the second terminal of the feedback resistor and the second terminal of the quartz crystal. A capacitance of the third capacitor, $C_d$, is chosen according to an equation $$C_d = C_L \frac{2k}{1-k},$$

where $C_L$ is an equivalent capacitance of the first and second load capacitors, k is a damping factor. In this way, a supply voltage to the inverting amplifier is damped at the second terminal of the quartz crystal with the damping factor k and thus to match a drive level of the quartz crystal.

According to one aspect of embodiments herein, the object is achieved by use of the crystal oscillator circuit described above for matching the supply voltage to the inverting amplifier to the drive level of the quartz crystal.

According to one aspect of embodiments herein, the object is achieved by a method for matching a supply voltage of an inverting amplifier to a drive level of a quartz crystal in a crystal oscillator circuit. The crystal oscillator circuit comprises an inverting amplifier having an input and an output, and a feedback resistor having a first terminal connected to the input of the inverting amplifier, and a second terminal connected to the output of the inverting amplifier. The crystal oscillator circuit further comprises a quartz crystal having a first terminal and a second terminal; a first load capacitor connected between the first terminal of the quartz crystal and a signal ground; a second load capacitor connected between the second terminal of the quartz crystal and the signal ground. The method comprises connecting a third capacitor between the second terminal of the feedback resistor and the second terminal quartz crystal and choosing a capacitance of the third capacitor, $C_d$, according an equation $$C_d = C_L \frac{2k}{1-k},$$

wherein $C_L$ is an equivalent capacitance of the first and second load capacitors, k is a damping factor. In this way, the supply voltage to the inverting amplifier is damped at the second terminal of the quartz crystal with the damping factor k to match the drive level of the quartz crystal.

The technique for matching a supply voltage with a drive level of a crystal in a crystal oscillator circuit is based on a Pierce oscillator circuit further comprising a capacitor $C_d$. The capacitor $C_d$ together with the load capacitor act as a capacitive voltage divider and the capacitance of this capacitor may be selected to reduce the supply voltage to match the drive level of the crystal oscillator without affecting the oscillation margin of the crystal.

The crystal oscillator circuit according to embodiments herein is particularly useful when one needs to reduce the drive level of a crystal by a factor of 2 or more. That is the mismatch is quite large and would imply that a large resistance would be needed using the alternative method described in prior art.

The matching method according to embodiments herein is especially suitable for but not limited to the following situations:

- Oscillator circuits with physically small quartz crystals where a low drive level is required, typically <400 uW;
- Oscillator circuits with a high supply voltage, e.g. larger than 1.5V;
- Oscillator circuits using inverting amplifiers with high voltage gain, e.g. buffered inverter with a square wave output voltage that swings rail to rail;

Oscillator circuits where reducing the load capacitance CL for the quartz crystal would result in unacceptable frequency pulling sensitivity;

Oscillator circuits where adding a damping resistor results in a severely diminished oscillation margin, e.g. when the shunt capacitance of the quartz crystal is high, typically larger than 1 pF;

Oscillator circuits where a transconductance of the inverting amplifier is unknown and thus it is not desired to introduce additional resistive damping which will reduce the oscillation margin;

Oscillator circuits where adding a damping resistor only has minor impact on reducing the drive level, i.e. the required damping resistance is too high.

Thus embodiments herein provide a technique for matching a supply voltage with a drive level of a crystal in a crystal oscillator circuit.

BRIEF DESCRIPTION OF THE DRAWINGS

Examples of embodiments will be described in more detail with reference to attached drawings in which.

DETAILED DESCRIPTION

As a part of developing embodiments herein, function, principle and some issues of a Pierce oscillator circuit with a damping resistor according to prior art will first be discussed and identified.

Figure 1:
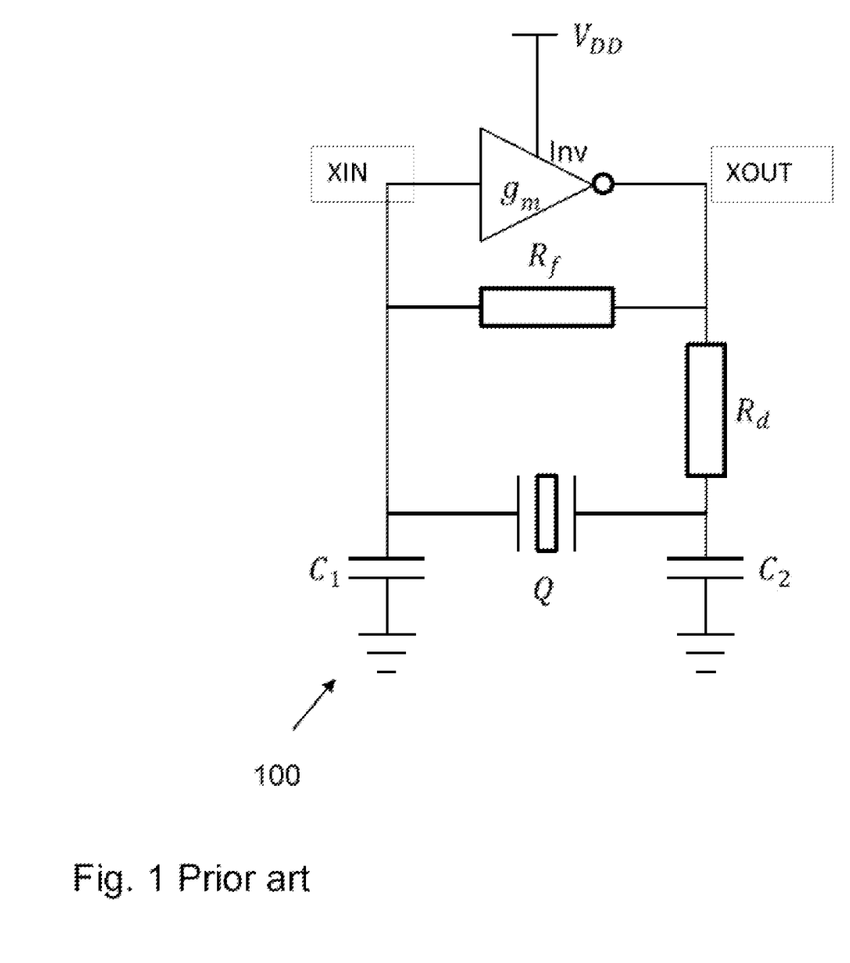
FIG. 1 is a schematic block diagram illustrating a Pierce oscillator circuit according to prior art.

FIG. 1 shows a simplified schematic view of a Pierce oscillator circuit 100. The Pierce oscillator circuit 100 comprises a crystal Q, a feedback resistor $R_f$, an inverter or inverting amplifier Inv, a first and second load capacitors, $C_1$ and $C_2$, and a damping resistor $R_d$, where $V_{DD}$ is supply voltage for the inverting amplifier Inv and $g_m$ is transconductance gain for the inverting amplifier Inv with unit mA/V.

The feedback resistor $R_f$ provides a bias point in a linear region of the transistors in the inverting amplifier Inv which is close to $V_{DD}/2$. A typical value for $R_f$ is around 1 MΩ. $R_f$ may be embedded in the oscillator circuitry. The feedback resistor $R_f$ transforms the inverter Inv with a logic gate into an analog amplifier.

The values of the load capacitors, $C_1$ and $C_2$, are chosen so that their series combination equals $C_L$. Typically, $C_1$ and $C_2$ are chosen slightly smaller than $2 \cdot C_L$ to account for stray capacitance, $C_S$. The capacitor type should have a low temperature coefficient and a low tolerance, e.g. 5%.

$$C_L = \frac{C_1 \cdot C_2}{C_1 + C_2} + C_S \quad \text{Eq. (1)}$$

-continued $$\text{where } C_S = \frac{C_{S1} \cdot C_{S2}}{C_{S1} + C_{S2}}$$

Cs is the total stray capacitance, mainly from input and output pad capacitances of the inverter.

A desirable characteristic of the Pierce oscillator circuit 100 is that the effects of the stray capacitances, $C_{S1}$ and $C_{S2}$ appear across $C_1$ and $C_2$ respectively, rather than across the crystal capacitance, $C_0$.

Figure 2:
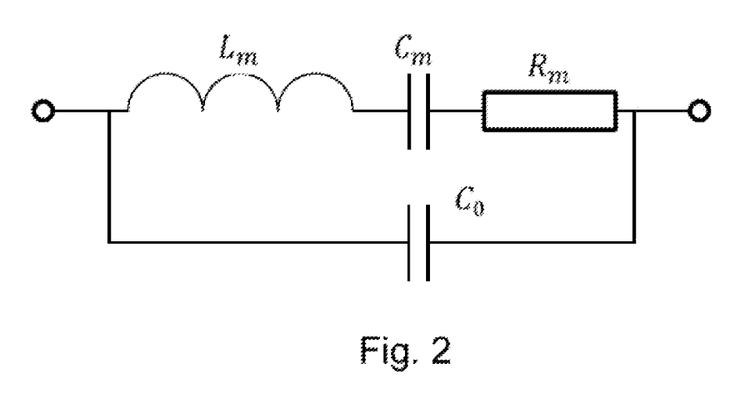
FIG. 2 is a schematic diagram illustrating an equivalent circuit for a crystal.

FIG. 2 shows an equivalent circuit for a crystal. The components $L_m$, $C_m$ and $R_m$ are called the motional arm and represent the mechanical behavior of the crystal.

The impedance of the crystal, if neglecting $R_m$, is $$Z(f, L_m, R_m, C_m, C_0) = \frac{1j}{2\pi f} \cdot \frac{(2\pi f)^2 \cdot L_m C_m - 1}{(C_0 + C_m) - (2\pi f)^2 \cdot L_m C_m C_0}$$

Figure 3:
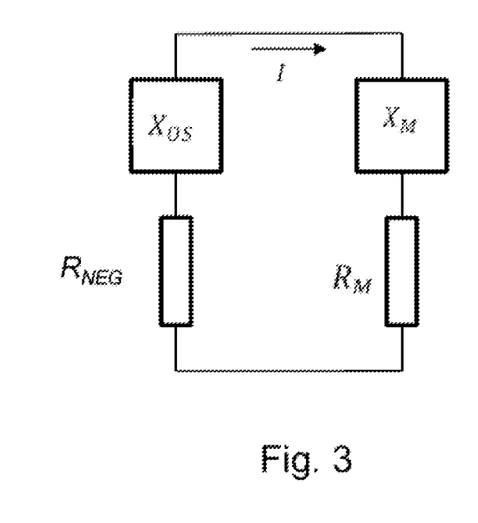
FIG. 3 is a schematic block diagram showing a negative resistance model for a crystal oscillator circuit.

FIG. 3 shows a negative resistance model for a crystal oscillator circuit which may be used to optimize $g_m$ vs $C_L$ and $C_0$ in order to achieve maximum oscillation margin. The conditions for oscillation in the negative resistance model are:

$-R_{NEG}=R_M$, i.e. the absolute value of the negative resistance equals to the resistance of the motional arm;

$-X_{OSC}=X_M$, i.e. the reactive part, i.e. capacitive part of the active oscillator network and the reactive part of the motional arm must cancel.

The oscillation margin for a given $g_m$ may be represented as a resistance. $R_S$, and be expressed as $$R_S = |R_{NEG}| - (R_d + 5R_e) \quad \text{Eq. (2)}$$

Where $R_e$ is the effective resistance of the crystal at any load capacitance, $C_L$, which may be defined as $$R_e = R_m \cdot \left(1 + \frac{C_0}{C_L}\right)^2 \quad \text{Eq. (3)}$$

The motional resistance $R_m$ may be up to $5R_m$ at startup, so the effective resistance $R_e$ may be up to $5R_e$ as well. When checking the oscillation margin for a crystal oscillator circuit, one may add a resistance in series with the crystal and check if the oscillation stops. So $R_S$ corresponds to the largest resistance that can be added in series with the crystal before oscillation stops.

The negative resistance, i.e. gain around the loop, is a function of $g_m$, $C_1$, $C_2$ and $C_0$. $R_{NEG\_min}$, will occur for either $g_{m\_min}$ or $g_{m\_max}$. $C_1$, $C_2$ and $C_0$ are parts of the active network.

The maximum achievable absolute value of the negative resistance drops as $C_0$ increases, which can be seen from the following equation:

$$R_{NEG} = \frac{-g_m C_1 C_2}{(2\pi f)^2 \cdot (C_1 C_2 + C_1 C_0 + C_2 C_0)^2 + (g_m C_0)^2}$$

A drive level of a crystal may be determined using the following equation:

$$P_x = R_e \cdot I^2$$

The effective resistance of the crystal at any load capacitance is $$R_e = R_m \cdot \left(1 + \frac{C_0}{C_L}\right)^2$$

where $R_m$ is the resistance of the crystal, and I is the current through the crystal which may be defined as $$I = \frac{V}{X_{C_1}} = V \cdot \omega \cdot C_1$$

Then $$P_x = R_e \cdot (V \cdot \omega \cdot C_1)^2$$

where V is a root mean square (RMS) value of an AC component of the voltage across $C_1$.

At resonance, the reactance part of the motional arm becomes inductive and parallel resonates with $C_L + C_0$. The current I through the crystal can then also be expressed as $$I = \frac{V_p}{\sqrt{2}} \cdot \omega \cdot (C_L + C_0)$$

where Vp is the peak voltage across the crystal, which gives $$P_x = R_e \cdot \left(2\pi f \cdot (C_L + C_0) \cdot \frac{V_p}{\sqrt{2}}\right)^2 = 2R_e \cdot (\pi f \cdot (C_L + C_0) \cdot V_p)^2 \quad \text{Eq. (4)}$$

Unbuffered inverters have a voltage gain in the range of hundreds. Buffered inverters have a voltage gain in the range of several thousands.

For a rough approximation of the power dissipated by the crystal, it is estimated that when the voltage at the output of the inverting amplifier, $X_{OUT}$, is a square wave, i.e. buffered inverter with an output voltage swing rail to rail with a peak-to-peak voltage swing close to $V_{DD}$, it approximately has a sine wave with peak voltage $V_p = V_{DD}$ across the crystal.

For oscillators with unbuffered inverters or with amplitude limitation control, or when measurements are available, the maximum voltage amplitude obtained across the crystal should be used when calculating the drive level. For a rough approximation of the power dissipated by the crystal when the voltage at the output of the inverting amplifier, $X_{OUT}$, is a sine wave, it can be assumed that a sine wave with peak voltage $V_p = V_{DD}/\sqrt{2}$ is present across the crystal.

It can be seen from Eq. (4), in order to reduce the drive level, $R_e$, $C_L$, and/or $V_p$ may be decreased. $R_m$ is given by the size of the crystal. A bigger crystal will have a lower $R_m$ but also a higher $C_0$. A lower $C_L$ will reduce drive level but it will also result in higher pulling sensitivity, i.e. frequency change per load capacitance change. $C_L$ should be chosen in order to maximize negative resistance $R_{NEG}$ that the active network of the crystal oscillator circuit can provide.

Thus, it may be required to reduce $V_p$ in order to reduce drive level. One way to reduce $V_p$ is to lower $V_{DD}$. One method often suggested in prior art is to add a series damping resistor $R_d$ with a value of:

$$R_d = X_{c2} = \frac{1}{2\pi f C_2}$$

A square wave with a peak-to-peak voltage swing equal to $V_{DD}$ at $X_{OUT}$ will appear on the other side of the damping resistor $R_d$ as a sine wave with a peak-to-peak voltage swing equal to 90% of $V_{DD}$, i.e. $\frac{4}{\pi} \cdot \frac{1}{\sqrt{2}} = 90\%$.

However, a damping resistor $R_d$ will directly reduce the oscillation margin as seen from Eq. (2).

In order to solve the above identified problem, the drive level may be reduced by adding a damping capacitor with capacitance $C_d$ according to embodiments herein. In this way, $C_2$ and the damping capacitor form a capacitive voltage divider which directly reduces $V_p$, expressed by $$V_p = k \cdot V_{dd}$$

where $$k = \frac{C_d}{C_d + C_2 + C_{52}} = \frac{C_d}{C_d + 2C_L},$$

is a damping factor.

Assume that the drive level without damping is $P_1$ and the target drive level is $P_t$, then $$P_t = k^2 \cdot P_1$$

The capacitance of the damping capacitor is given by $$C_d = C_L \cdot \frac{2k}{1-k}$$

Figure 4:
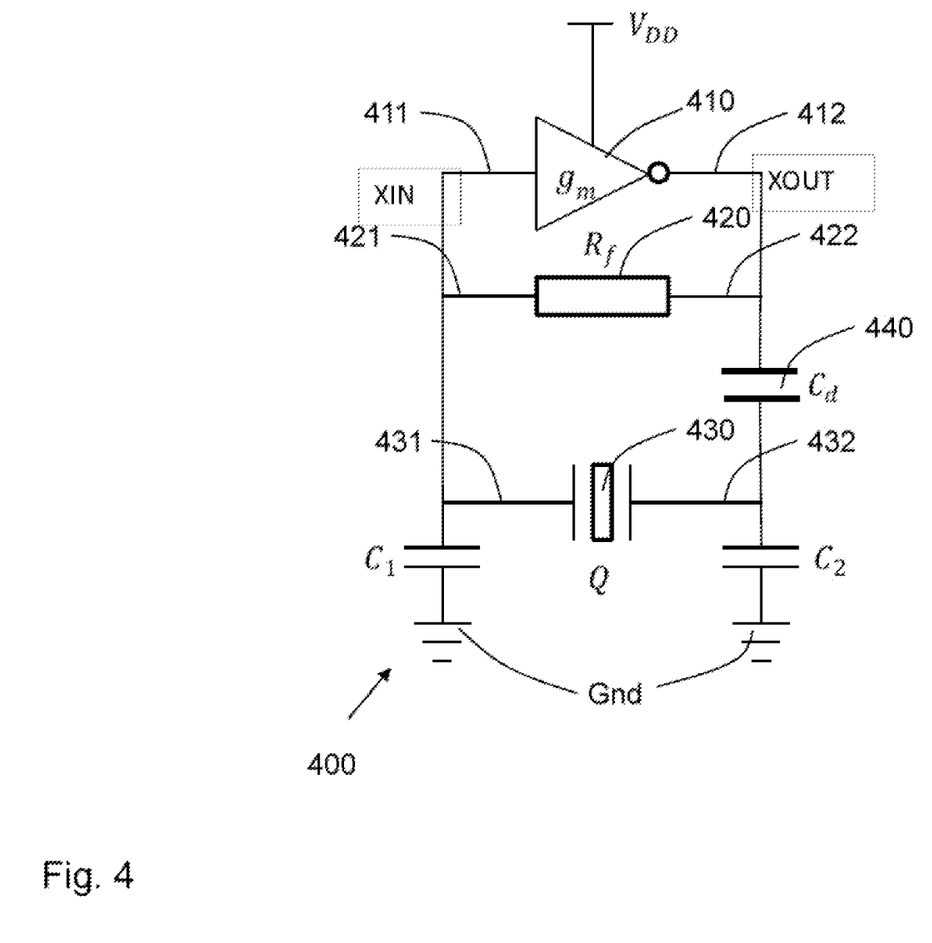
FIG. 4 is a schematic block diagram illustrating an oscillator circuit according to embodiments herein.

FIG. 4 shows a crystal oscillator circuit 400 according to embodiments herein. The crystal oscillator circuit 400 comprises an inverting amplifier 410 having an input 411 and an output 412; a feedback resistor 420 having a first terminal 421 connected to the input of the inverting amplifier 410, and a second terminal 422 connected to the output of the inverting amplifier 410; a quartz crystal 430 having a first terminal 431 and a second terminal 432; a first load capacitor $C_1$ connected between the first terminal 431 of the quartz crystal 430 and a signal ground Gnd; a second load capacitor $C_2$ connected between the second terminal 432 of the quartz crystal 430 and the signal ground Gnd; a third capacitor 440 connected between the second terminal 422 of the feedback resistor 420 and the second terminal 432 of the quartz crystal 430.

A capacitance of the third capacitor 440, $C_d$, is chosen according to the equation $$C_d = C_L \frac{2k}{1-k},$$

wherein $C_L$ is an equivalent capacitance of the first and second load capacitors, k is a damping factor, such that a supply voltage to the inverting amplifier 410 is damped at the second terminal 432 of the quartz crystal 430 with the damping factor k to match a drive level of the quartz crystal 430. The drive level is usually given in the product specification, it indicates the power consumption by the crystal while oscillation circuit works. It is important for the crystal to keep within the drive level specification. So the supply voltage at the crystal should be in a proper level so that the power consumption by the crystal should not exceed the drive level specified in the crystal specification.

Figure 5:
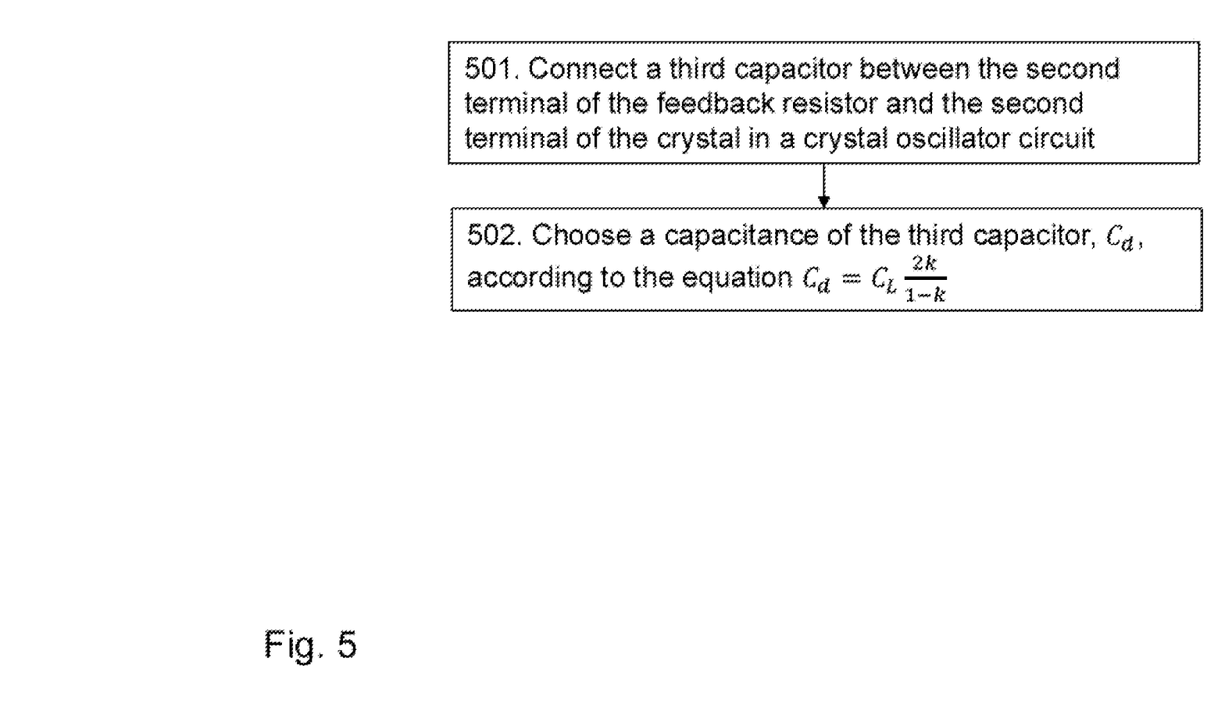
FIG. 5 is a flow chart of a method for matching the drive level of a crystal.

FIG. 5 shows a flow chart of a method for matching a supply voltage of an inverting amplifier to a drive level of a quartz crystal in the crystal oscillator circuit 400. The method comprises connecting 501 a third capacitor between the second terminal of the feedback resistor and the second terminal of the quartz crystal.

The method further comprises choosing 502 a capacitance of the third capacitor, $C_d$, according to the equation $$C_d = C_L \frac{2k}{1-k},$$

where $C_L$ is an equivalent capacitance of the first and second load capacitors, k is a damping factor, such that the supply voltage to the inverting amplifier is damped at the second terminal of the quartz crystal with the damping factor k in order to match the drive level of the quartz crystal.

To illustrate advantages of adding a damping capacitor according to the embodiments herein, a few different crystals are investigated. Typically, the maximum drive level for these crystals is specified at 200-300 uW depending on the manufacturer. According to the datasheets, the maximum shunt capacitance, $C_{0\_max}$, for the different crystals is specified in a range of 1-3 pF. A typical shunt capacitance, $C_{0\_typ}$, is in a range of 0.5-1 pF. One example is given in the following.

Example 1: $V_{DD}$=3.3V, f=24 MHz, $C_L$=10 pF, $C_{0\_typ}$=0.57 pF, $C_{0\_max}$=1.0 pF, $R_{m\_max}$=80Ω

One can calculate according to Eq. (3) the effective resistance of the crystal:

$R_{e\_max} = R_e(R_{m\_max}, C_L, C_{0\_typ}) = 89.4Ω$

And the drive level according to Eq. (4):

$P_t = P_x(R_{e\_max}, f, C_L, C_{0\_typ}, V_{DD}) = 1.2$ mW>300 uW

One can see that the drive level for this crystal is too high and has to be reduced. The problem is mainly caused by the high supply voltage.

If load capacitanceo is decreased, i.e. $C_L$=8 pF, the drive level is:

$P_t = P_x(R_{e\_max}, f, C_L, C_{0\_typ}, V_{DD}) = 835$ uW

The drive level for this crystal is now lower because $C_L$ has been decreased but it is still too high and has to be further reduced.

Assume a target drive level is $P_t$=280 uW, $P_t = k^2 \cdot P_1$, where k is the required voltage damping factor.

Then the damping capacitor is $$C_d = C_L \cdot \frac{2 \cdot \sqrt{\frac{P_t}{P_1}}}{1 - \sqrt{\frac{P_t}{P_1}}} = 22 \text{ pF}$$

Example 2: $V_{DD}$=18V, f=50 MHz, $C_L$=8 pF, $C_{0\_typ}$=1 pF, $C_{0\_typ}$=3 pF, $R_{m\_max}$=50Ω

One can calculate according to Eq. (3) the effective resistance of the crystal:

$R_{e\_max} = R_e(R_{m\_max}, C_L, C_{0\_typ}) = 63$ Ω

And the drive level according to Eq. (4):

$P_t = P_x(R_{m\_max}, f, C_L, C_{0\_typ}, V_{DD}) = 1.2$ mW>200 uW

One can see that the drive level for this crystal is too high and has to be reduced. The problem is mainly caused by the high supply voltage.

Assume a target drive level is $P_t$=180 uW, $P_t = k^2 \cdot P_1$, where k is the required voltage damping factor.

Then the damping capacitor is $$C_d = C_L \cdot \frac{2 \cdot \sqrt{\frac{P_t}{P_1}}}{1 - \sqrt{\frac{P_t}{P_1}}} = 10 \text{ pF}$$

Some measurements have been performed for the crystal oscillator circuit of above examples and the measured drive level was close to the estimated drive level while the negative resistance was maintained.

The method for matching the supply voltage of an inverting amplifier to the drive level of a quartz crystal according to embodiments herein is especially useful when the mismatch is quite large. A large mismatch of the supply voltage of an inverting amplifier to the drive level of a quartz crystal implies that a large resistance would be needed according to the prior art solution, which would also severely reduce the oscillation margin. For example, when it is required to reduce the drive level by a factor of 2 or more, i.e. $P_1 > 2 \cdot P_t$, where the drive level without damping is $P_1$ and the target drive level is $P_t$.

In order to avoid the problems with frequency accuracy and accelerated aging of the quartz crystal, the estimated power dissipation, $P_x$, shall be less than the maximum drive level, DL, specified in the datasheet for a quartz crystal.

So it is aimed for $$k^2 \cdot 2R_m \cdot \left(1 + \frac{C_0}{C_L}\right)^2 (\pi f \cdot (C_L + C_0) \cdot V_p)^2 < DL$$

which gives $$\frac{1}{k^2 \cdot 2R_m \cdot \left(1 + \frac{C_0}{C_L}\right)^2 (\pi f \cdot (C_L + C_0))^2} > \frac{V_p^2}{DL}$$

For an inverter with square wave output, i.e. a buffered inverter with high voltage gain, e.g. 1000×, the method is especially useful when $$\frac{1}{2R_m \cdot \left(1 + \frac{C_0}{C_L}\right)^2 (\pi f \cdot (C_L + C_0))^2} < \frac{V_{DD}^2}{2 \cdot DL}$$

For an inverter with sine wave output, i.e. an unbuffered inverter with low voltage gain, e.g. 100×, the method is especially useful when $$\frac{1}{2R_m \cdot \left(1 + \frac{C_0}{C_L}\right)^2 (\pi f \cdot (C_L + C_0))^2} < \frac{V_{DD}^2}{4 \cdot DL}$$

So according to some embodiments herein, when the inverting amplifier is a buffered inverter and an output voltage from the inverting amplifier is a square wave, a typical damping factor may be $k<1/\sqrt{2}$ or even $k<\frac{1}{2}$.

When an output voltage from the inverting amplifier is a sine wave, a typical damping factor may be $k<1/\sqrt{2}$.

Although in some prior art, there is a capacitor connected at the same place as the damping capacitor $C_d$, but it has a different function. For example, in CN104052465 FIG. 5, the capacitor CS is for phase compensation to satisfy zero phase shift. In "HCMOS Crystal Oscillators", Fairchild Semiconductor Application Note 340, May 1983, it is suggested that when the oscillator is working at a high frequency, e.g. above 4 MHz, the damping resistor R2 should be changed to a small capacitor to avoid the additional phase shift of R2. The value of this capacitor is approximately $1/\omega C$ but not less than about 20 pF.

Therefore there is a significant difference in function and purpose of the damping capacitor according to embodiments herein compared to the prior art.

To summarise, the technique for matching the supply voltage with the drive level of a crystal in a crystal oscillator circuit according to embodiments herein is based on a Pierce oscillator circuit which further comprises a damping capacitor, $C_d$. The capacitor $C_d$ together with the load capacitor act as a capacitive voltage divider and the capacitance of this capacitor may be selected to reduce the supply voltage in order to match the drive level of the crystal oscillator without affecting the oscillation margin of the crystal oscillator circuit.

The crystal oscillator circuit according to embodiments herein is particularly useful when one needs to reduce the drive level of a crystal by a factor of 2 or more. That is the mismatch is quite large and implies that a large resistance will be needed by using a damping resistor described in prior art, which may result in large phase shift, lower oscillation margin, or may not even start the oscillation.

The matching method according to embodiments herein is especially suitable for but not limited to the following situations:

Oscillator circuits with physically small quartz crystals where a low drive level is required, typically <400 uW;

Oscillator circuits with a high supply voltage, e.g. larger than 1.5V;

Oscillator circuits using inverting amplifiers with high voltage gain, e.g. buffered inverter with a square wave output voltage that swings rail to rail;

Oscillator circuits where reducing the load capacitance $C_L$ for the quartz crystal would result in unacceptable frequency pulling sensitivity;

Oscillator circuits where adding a damping resistor results in a severely diminished oscillation margin, e.g. when the shunt capacitance of the quartz crystal is high, typically larger than 1 pF. This is because that the oscillation margin is small, and adding a resistive voltage divider would then affect the oscillation of the crystal;

Oscillator circuits where a transconductance of the inverting amplifier is unknown and thus it is not desired to introduce additional resistive damping that will reduce the oscillation margin;

Oscillator circuits where adding a damping resistor only has minor impact on reducing the drive level, i.e. the required damping resistance is too high.

Figure 6:
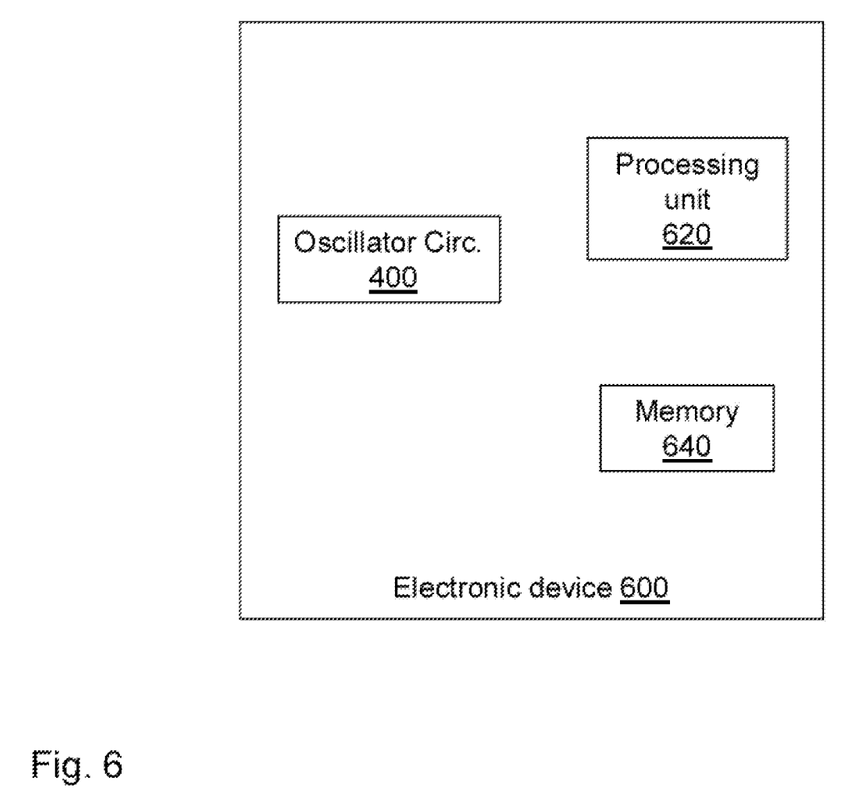
FIG. 6 is a block diagram illustrating an electronic device in which an oscillator circuit according to embodiments herein may be implemented.

The crystal oscillator circuit 400 and method therein for matching the supply voltage of an inverting amplifier to the drive level of a quartz crystal according to embodiments herein is suitable for any electronic device where a dock signal is needed. FIG. 6 shows an electronic device 600 in which the crystal oscillator circuit 400 according to embodiments herein may be implemented. The electronic device 600 may further comprise a processing unit 620 for information storage and signal processing, a memory 640 for storage data, configurations, program code etc. The electronic device 600 may be any one of a transmitter, a receiver, a transceiver, a frequency synthesizer, a wireless communication device, a wireless data acquisition device, a camera such as a monitoring camera or a network video recorder, a home automation device, a data logger, a video encoder, a physical access controller or a door station.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A crystal oscillator circuit comprising:
an inverting amplifier having an input and an output;
a feedback resistor having a first terminal connected to the input of the inverting amplifier, and a second terminal connected to the output of the inverting amplifier;
a quartz crystal having a first terminal and a second terminal;
a first load capacitor ($C_1$) connected between the first terminal of the quartz crystal and a signal ground (Gnd);
a second load capacitor ($C_2$) connected between the second terminal of the quartz crystal and the signal ground (Gnd);
a third capacitor connected between the second terminal of the feedback resistor and the second terminal of the quartz crystal;
Characterized by that
a capacitance of the third capacitor, $C_d$, is chosen according to an equation $$C_d = C_L \frac{2k}{1-k},$$

wherein $C_L$ is an equivalent capacitance of the first and second load capacitors, k is a damping factor, such that a supply voltage to the inverting amplifier (410) is damped at the second terminal of the quartz crystal with the damping factor k to match a drive level of the quartz crystal, wherein when the inverting amplifier is a buffered inverter and an output voltage from the inverting amplifier is a square wave, the required damping factor is $k<1/\sqrt{2}$ or $k<\frac{1}{2}$.

2. A crystal oscillator circuit according to claim 1, wherein the drive level is reduced by a factor of 2 or more than 2.

3. A crystal oscillator circuit, comprising:

an inverting amplifier having an input and an output;

a feedback resistor having a first terminal connected to the input of the inverting amplifier, and a second terminal connected to the output of the inverting amplifier;

a quartz crystal having a first terminal and a second terminal;

a first load capacitor ($C_1$) connected between the first terminal of the quartz crystal and a signal ground (Gnd);

a second load capacitor ($C_2$) connected between the second terminal of the quartz crystal and the signal ground (Gnd);

a third capacitor connected between the second terminal of the feedback resistor and the second terminal of the quartz crystal;

Characterized by that a capacitance of the third capacitor, $C_d$, is chosen according to an equation $$C_d = C_L \frac{2k}{1-k},$$

wherein $C_L$ is an equivalent capacitance of the first and second load capacitors, k is a damping factor, such that a supply voltage to the inverting amplifier (410) is damped at the second terminal of the quartz crystal with the damping factor k to match a drive level of the quartz crystal, wherein when an output voltage from the inverting amplifier is a sine wave, the required damping factor is $k<1/\sqrt{2}$.

4. A crystal oscillator circuit according to claim 1, wherein a shunt capacitance of the quartz crystal is larger than 1 pF.

5. A crystal oscillator circuit according to claim 1, wherein the drive level of the quartz crystal is lower than 400 uW.

6. A crystal oscillator circuit according to claim 1, wherein a supply voltage to the inverting amplifier is larger than 1.5 V.

7. An electronic device comprising a crystal oscillator circuit according to claim 1.

8. The electronic device according to claim 7 comprising any of a transmitter, a receiver, a transceiver, a frequency synthesizer, a wireless communication device, a wireless data acquisition device, a camera such as a monitoring camera or a network video recorder, a home automation device, a data logger, a video encoder, a physical access controller or a door station.

9. A method for matching a supply voltage of an inverting amplifier to a drive level of a quartz crystal in a crystal oscillator circuit, wherein the crystal oscillator circuit comprises:

an inverting amplifier having an input and an output;

a feedback resistor having a first terminal connected to the input of the inverting amplifier, and a second terminal connected to the output of the inverting amplifier;

a quartz crystal having a first terminal and a second terminal;

a first load capacitor ($C_1$) connected between the first terminal of the quartz crystal and a signal ground;

a second load capacitor ($C_2$) connected between the second terminal of the quartz crystal and the signal ground; and the method comprising:

connecting a third capacitor between the second terminal of the feedback resistor and the second terminal of the quartz crystal; and choosing a capacitance of the third capacitor, $C_d$, according to an equation $$C_d = C_L \frac{2k}{1-k},$$

wherein $C_L$ is an equivalent capacitance of the first and second load capacitors, k is a damping factor, such that the supply voltage to the inverting amplifier is damped at the second terminal of the quartz crystal with the damping factor k to match the drive level of the quartz crystal, wherein when the inverting amplifier is a buffered inverter and an output voltage from the inverting amplifier is a square wave, the required damping factor is $k<1/\sqrt{2}$ or $k<1/2$.

* * * * *